(12) United States Patent
Choi (10) Patent No.: US 9,929,116 B2
(45) Date of Patent: Mar. 27, 2018

(54) ELECTRONIC DEVICE MODULE AND METHOD OF MANUFACTURING THE SAME

(71) Applicant: Samsung Electro-Mechanics Co., Ltd., Suwon-si (KR)

(72) Inventor: Seung Yong Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/493,712

(22) Filed: Apr. 21, 2017

(65) Prior Publication Data

US 2017/0229411 A1 Aug. 10, 2017

Related U.S. Application Data

(62) Division of application No. 14/858,275, filed on Sep. 18, 2015, now Pat. No. 9,673,123.

(30) Foreign Application Priority Data

Sep. 19, 2014 (KR) .................. 10-2014-0125174
Jan. 21, 2015 (KR) .................. 10-2015-0010201

(51) Int. Cl.
*H01L 21/48* (2006.01)
*H01L 23/00* (2006.01)
*H01L 21/56* (2006.01)
*H01L 23/31* (2006.01)
*H01L 23/538* (2006.01)

(52) U.S. Cl.
CPC ............ *H01L 24/14* (2013.01); *H01L 21/486* (2013.01); *H01L 21/4853* (2013.01); *H01L 21/4867* (2013.01); *H01L 21/565* (2013.01); *H01L 23/3114* (2013.01); *H01L 23/5384* (2013.01); *H01L 23/5389* (2013.01); *H01L 2224/14051* (2013.01); *H01L 2224/14517* (2013.01)

(58) Field of Classification Search
CPC ....... H01L 21/70; H01L 24/14; H01L 21/565; H01L 21/4853; H01L 21/486; H01L 21/4867
See application file for complete search history.

(56) References Cited

U.S. PATENT DOCUMENTS

| 2004/0017008 A1 | 1/2004 | Ueda |
| 2004/0178514 A1 | 9/2004 | Lee et al. |
| 2007/0273014 A1 | 11/2007 | Lee et al. |
| 2011/0068481 A1 | 3/2011 | Park |

(Continued)

FOREIGN PATENT DOCUMENTS

| JP | 2001-44367 A | 2/2001 |
| JP | 2004-63761 A | 2/2004 |

(Continued)

OTHER PUBLICATIONS

Korean Office Action dated Mar. 8, 2016, in counterpart Korean Application No. 10-2015-0010201 (7 pages in English, 5 pages in Korean).

*Primary Examiner* — Douglas Menz
(74) *Attorney, Agent, or Firm* — NSIP Law (57) ABSTRACT

The electronic device module includes a sealing part sealing an electronic component therein, and an external connection terminal disposed on one surface of the sealing part. The electronic device module also includes a dummy bonding part configured on a surface of the sealing part and spaced apart from the external connection terminal.

6 Claims, 12 Drawing Sheets

(56) References Cited

U.S. PATENT DOCUMENTS

2013/0127025 A1 5/2013 Cho
2013/0292831 A1 11/2013 Liu

FOREIGN PATENT DOCUMENTS

| JP | 2006-5163 | A | 1/2006 |
| KR | 10-0594248 | B1 | 6/2006 |
| KR | 10-0782774 | B1 | 12/2007 |
| KR | 10-2013-0056570 | A | 5/2013 |

ELECTRONIC DEVICE MODULE AND METHOD OF MANUFACTURING THE SAME

CROSS-REFERENCE TO RELATED APPLICATIONS

This application is a divisional of application Ser. No. 14/858,275 filed on Sep. 18, 2015, which claims the priorities and benefits under 35 USC 119(a) of Korean Patent Application Nos. 10-2014-0125174 filed on Sep. 19, 2014 and 10-2015-0010201 filed on Jan. 21, 2015, with the Korean Intellectual Property Office, the disclosures of which are incorporated herein by reference.

BACKGROUND

1. Field

The following description relates to an electronic device module which is reliably bonded to a main board, and a method of manufacturing the same.

2. Description of Related Art

Demand for portable devices has increased rapidly with the expansion of the market for electronic products. There is an on-going demand for the miniaturization and lightening of electronic devices mounted on electronic products.

In order to further miniaturize and lighten electronic devices, system on chip (SOC) technology in which a plurality of individual components are provided on a single chip, system in package (SIP) technology in which a plurality of individual components are integrated in a single package, as well as, technology of decreasing the respective sizes of mounted components is needed.

Furthermore, in order to manufacture an electronic device module having a relatively small size with high performance, a structure in which electronic components are mounted on both surfaces of a board has also been developed.

However, in such a structure in which electronic components are mounted on both surfaces of a board, a sealing part needs to be formed on both surfaces of the board, thereby making it difficult to form external connection terminals.

In addition, because external connection terminals are mainly disposed on outer surfaces of the sealing part, in a case in which an impact or the force of an external impact is transferred to an electronic device module, the external connection terminals may be damaged. As a result, the electronic device module and the main board may be electrically disconnected from each other, such that bonding reliability between the electronic device module and the main board may decrease.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided an electronic device module, including a sealing part sealing an electronic component therein; an external connection terminal disposed on one surface of the sealing part; and a dummy bonding part configured on a surface of the sealing part and spaced apart from the external connection terminal.

The electronic device module may also include a board, wherein the electronic device is mounted on the board, the board is mounted on a main board, and the dummy bonding part is bonded to the main board.

The electronic device module may also include a connection conductor configured to penetrate through the sealing part and have one end bonded to the board and another end bonded to the external connection terminal.

The dummy bonding part may be formed of a same material as the external connection terminal.

The dummy bonding part may be formed of a thermoplastic resin.

A shape of the dummy bonding part may correspond to a shape of the external connection terminal.

The dummy bonding part may have a form of a pad.

The sealing part may include a coupling groove at a position at which the dummy bonding part is bonded to increase a bonded area between the sealing part and the dummy bonding part.

The coupling groove may include a protrusion therein.

The electronic device module may include an auxiliary pattern configured on one surface of the sealing part and electrically connecting the dummy bonding part and the connection conductor to each other.

In accordance with an embodiment, there is provided a method of manufacturing an electronic device module, including: sealing an electronic component to form a sealing part, wherein the electronic component is mounted on a board; and forming an external connection terminal and a dummy bonding part on one surface of the sealing part.

The method may also include forming a connection conductor penetrating through the sealing part; and bonding the external connection terminal to the connection conductor.

The forming of the external connection terminal and the dummy bonding part may include applying a solder paste to positions in which the external connection terminal and the dummy bonding part are to be formed on a surface of the sealing part; and melting and hardening the solder paste.

The forming of the external connection terminal and the dummy bonding part may include attaching the external connection terminal to a surface of the sealing part; forming a coupling groove at a position in which the dummy bonding part is to be formed on a surface of the sealing part; and attaching the dummy bonding part to the coupling groove.

A thermoplastic adhesive may be applied to the coupling groove to attach the dummy bonding part to the coupling groove.

The forming of the dummy bonding part may include forming a coupling groove on a surface of the sealing part; forming an under bump metallization (UBM) in the coupling groove; and attaching the dummy bonding part to the UBM.

The method may also include forming an auxiliary pattern on one surface the sealing part, the auxiliary pattern electrically connecting the dummy bonding part and the connection conductor to each other.

Other features and aspects will be apparent from the following detailed description, the drawings, and the claims.

BRIEF DESCRIPTION OF DRAWINGS

The above and other aspects, features and other advantages of the present disclosure will be more clearly understood from the following detailed description taken in conjunction with the accompanying drawings, in which.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be understood that when an element or layer is referred to as being "on" or "connected to" or "attached to" another element or layer, it can be directly on or connected to the other element or layer or through intervening elements or layers may be present. In contrast, when an element is referred to as being "directly on" or "directly connected to" or "directly attached to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. These terms do not necessarily imply a specific order or arrangement of the elements, components, regions, layers and/or sections. Thus, a first element, component, region, layer or section discussed below could be termed a second element, component, region, layer or section without departing from the teachings description of the present invention.

Spatially relative terms, such as "lower," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 1:
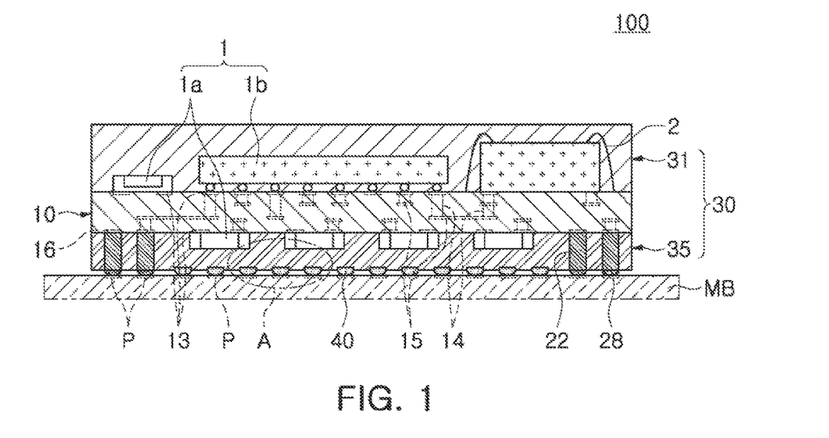
FIG. 1 is a cross-sectional view schematically illustrating an electronic device module, according to an embodiment.
Figure 2:
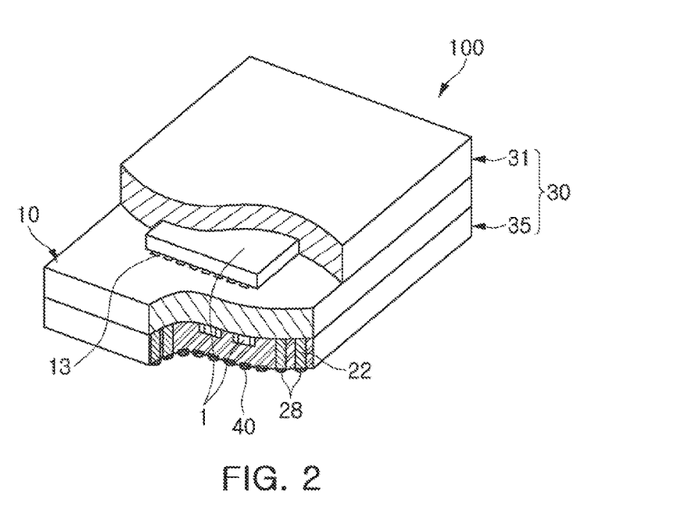
FIG. 2 is a partially cut-away perspective view illustrating internal structures of the electronic device module illustrated in FIG. 1, according to an embodiment.
Figure 3:
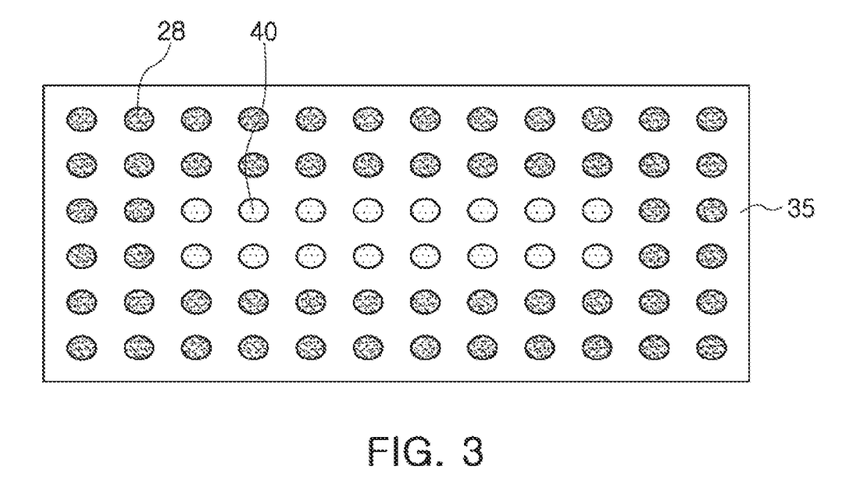
FIG. 3 is a bottom view of the electronic device module illustrated in FIG. 1, according to an embodiment.
Figure 4:
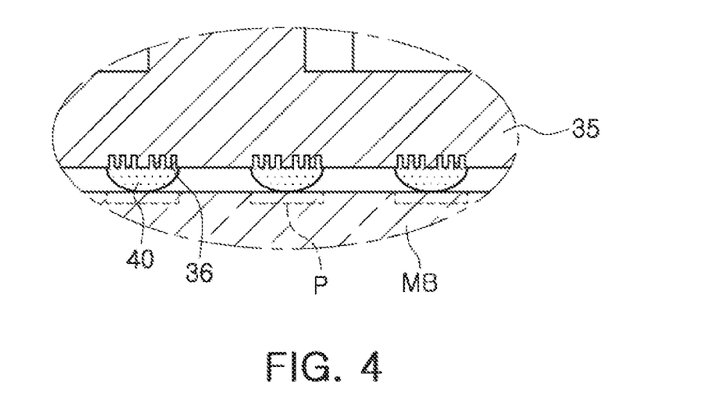
FIG. 4 is a partially enlarged cross-sectional view of section A of FIG. 1, according to an embodiment.

FIG. 1 is a cross-sectional view schematically illustrating an electronic device module, according to an embodiment. In addition, FIG. 2 is a partially cut-away perspective view illustrating internal structures of the electronic device module illustrated in FIG. 1; FIG. 3 is a bottom view of the electronic device module illustrated in FIG. 1; and FIG. 4 is a partially enlarged cross-sectional view of section A of FIG. 1.

Referring to FIGS. 1 through 3, an electronic component module 100, according to an embodiment, includes electronic components 1, a board 10, a sealing part 30, connection conductors 22, and dummy bonding parts 40.

The electronic components 1 may include various components such as a passive component 1a and an active component 1b and may be any electronic component 1 that may be mounted on the board.

The electronic components 1 may be mounted on both upper and lower surfaces of a board 10 to be described below. A case in which both, the active component 1b and the passive component 1a are mounted on the upper surface of the board 10 and only the passive component 1a is mounted on the lower surface of the board 10, is illustrated by way of example in FIG. 1. However, the electronic components 1 are not limited to being mounted as described above, but may be disposed on both surfaces of the board 10, in various manners, depending on sizes or forms thereof and a design of the electronic device module 100.

The electronic components 1 may be mounted on the board 10 in a flip-chip manner or may be electrically bonded to the board 10 by bonding wires 2.

The board 10 has at least one electronic component 1 mounted on at least one surface thereof. As the board 10, various kinds of boards, for example, a ceramic board, a printed circuit board (PCB), or a flexible board may be used. In addition, mounting electrodes 13 to mount the electronic components 1 or a wiring pattern (not illustrated) and electrically connect the mounting electrodes 13 to each other are formed on one surface or both surfaces of the board 10.

The board 10, according to an embodiment, is a multi-layer board including a plurality of layers, and circuit patterns 15 for forming electrical connections are formed between the plurality of layers. In accordance with an alternative embodiment, the board 10 is a single layer board including at least one circuit pattern 15 to form electrical connections.

The board 10, according to an embodiment, includes conductive vias 14 electrically connecting the mounting electrodes 13, which is formed on both surfaces thereof, to the circuit patterns 15 formed therein.

Further, the board 10, according to an embodiment, also includes connection pads 16 to enable external connection between the electronic device module 100 and an external device. The connection pads 16 are formed on the lower surface of the board 10. The connection pads 16 are exposed to the outside of the board 10. However, the connection pads 16 are not limited to being exposed to the outside of the board 10. That is, some of the connection pads 16 may be covered with a dielectric, and only a portion thereof may be exposed to the outside of the board 10.

The connection pads 16 are provided to be electrically connected to connection conductors 22, to be described below, and are connected to external connection terminals 28 through the connection conductors 22.

The board 10, according to an embodiment is a board on which a plurality of common mounting regions is repeatedly disposed in order that a plurality of individual electrical components shown in the electronic device module of FIG. 1 may be simultaneously manufactured. In detail, the board 10, according to an embodiment, is an electrical board having a quadrangular shape with a wide area and having a long strip shape. In this case, the electronic device module may be manufactured for each of a plurality of individual module mounting regions.

The sealing part 30 includes a first sealing part 31 formed on the upper surface of the board 10 and a second sealing part 35 formed on the lower surface of the board 10.

The sealing part 30 seals the electronic components 1 mounted on both surfaces of the board 10. In addition, the sealing part 30 is provided between the electronic components 1 mounted on the board 10 to prevent short-circuits from being generated between the electronic components 1. The sealing part 30 fixes the electronic components 1 to the board while enclosing outer portions of the electronic components 1, thereby protecting the electronic components 1 from external impacts.

The sealing part 30 is formed of an insulating material such as an epoxy molding compound (EMC), including a resin material such as epoxy, or the like.

The first sealing part 31, according to an embodiment, covers the entirety of one surface of the board 10. In addition, a case in which all of the electronic components 1 are embedded in the first sealing part 31 has been described by way of example in the embodiment. However, all of the electronic components 1 are not limited to being embedded in the first sealing part 31, but may be variously applied. For example, at least one of the electronic components 1 embedded in the first sealing part 31 may be partially exposed to the outside of the first sealing part 31.

The second sealing part 35 is formed on the lower surface of the board 10 and embeds the connection conductors 22 and the electronic components 1 therein. In one configuration, the second sealing part 35 fully embeds the connection conductors 22 and the electronic components 1 therein. In another configuration, the second sealing part 35 partially embeds at least one of the connections conductors 22 and the electronic components 1 therein.

In a further configuration, the second sealing part 35 may also expose some of the electronic components 1 externally, if necessary.

In addition, one or more via holes 37 (see FIG. 12) may be formed in the molding part 30, according to an embodiment, and the connection conductors 22 may be disposed in the via holes 37.

Each of the connection conductors 22 is disposed to contact at least one surface of the board 10, and has one end bonded to the board 10 and the other end exposed to the outside of the sealing part 30. That is, the connection conductors 22 are formed in the sealing part 30 to penetrate through the sealing part 30.

The connection conductor 22 is formed of a conductive material, for example, copper, gold, silver, aluminum, or alloys.

The connection conductor 22, according to an embodiment, may have a cylindrical shape. However, a shape of the connection conductor 22 is not limited thereto. That is, both ends of the connection conductor 22 may have different areas. For example, the connection conductor 22 may have a conical shape in which a horizontal cross-sectional area thereof is reduced toward one end thereof.

The external connection terminals 28 are bonded to the other ends of the connection conductors 22. The external connection terminals 28 electrically and physically connect the electronic device module 100 and a main board MB (see FIG. 1), where the electronic device module 100 is mounted to each other. The external connection terminal 28 has a bump shape, but is not limited thereto. That is, the external connection terminal 28 may have various shapes such as a solder ball shape and other similar or corresponding shapes.

A case in which the connection conductors 22 are formed in the second sealing part 35 has been described by way of example, in accord with an embodiment. However, the connection conductors 20 are not limited to being formed in the second sealing part 35, but may also be formed in the first sealing part 35.

The shape of the dummy bonding parts 40, according to an embodiment, may be similar to or correspond to the shape of that of the external connection terminals 28. Hereinafter, the dummy bonding parts 40 will be referred to as dummy terminals.

One or more dummy terminals 40 are formed on an outer surface of the sealing part 30. The dummy terminals 40 are configured to increase coupling force between the electronic device module 100 and the main board MB. For instance, when the electronic device module 100 is mounted on the main board MB, the dummy terminals 40 are bonded to the main board MB together with the external connection terminals 28 to bond the electronic device module 100 and the main board MB.

The dummy terminal 40, according to an embodiment, are formed of the same material as that of the external connection terminal 28. Therefore, the dummy terminals 40 are formed together with the external connection terminals 28 at the time of forming the external connection terminals 28. In addition, in one configuration, the dimensions or size of the dummy terminals 40 are similar or close to, correspond to, or is the same as that of the external connection terminals 28.

The dummy terminals 40 are not limited to being formed as described above. For example, the dummy terminals 40 may be formed to be larger or smaller than the external connection terminals 28, and may also be formed in a separate process from the external connection terminals 28.

Furthermore, in a case in which the dummy terminals 40 are formed of the same material as the external connection terminals 28, conductive pads P, to which the dummy terminals 40 may be bonded, are included on the main board MB.

The dummy terminals 40 are formed in a region in which the external connection terminals 28 are not formed. In an embodiment, as illustrated in FIG. 3, the external connection terminals 28 are disposed in portions of the second sealing part 35, adjacent to edges of a lower surface of the second sealing part 35. Therefore, in one configuration, the dummy terminals 40 are disposed in the center of the second sealing part 35.

However, positions of the dummy terminals 40 and the external connection terminals 28 are not limited thereto. That is, in another configuration, the external connection terminals 28 are disposed in the center of the lower surface of the second sealing part 35, and the dummy terminals 40 are disposed along a circumference of the second sealing part 35.

In addition, as illustrated in FIG. 4, coupling grooves 36 are formed in the lower surface of the second sealing part 35 to which the dummy terminals 40 are attached. The coupling grooves 36 firmly attach the dummy terminals 40 to the lower surface of the second sealing part 35.

Figure 5A:
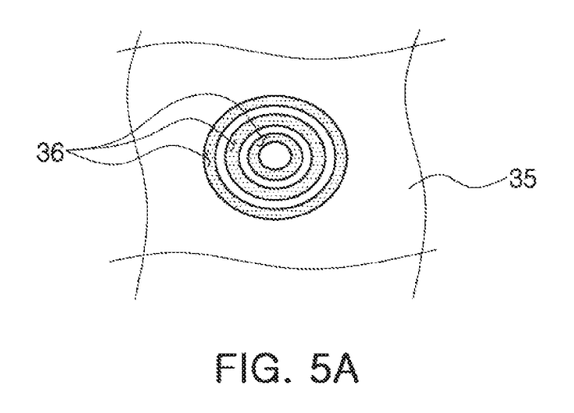
FIGS. 5A and 5B are plan views schematically illustrating a coupling groove according to an exemplary embodiment in the present disclosure, according to an embodiment.
Figure 5B:
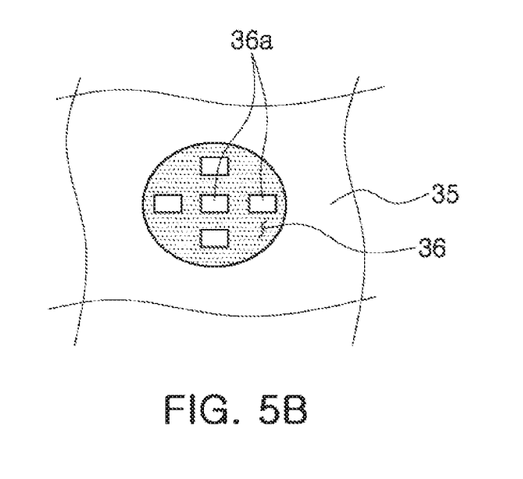

FIGS. 5A and 5B are plan views schematically illustrating a coupling groove, according to an embodiment, wherein FIG. 5A illustrates a plan view of the coupling groove illustrated in FIG. 4, and FIG. 5B illustrates a coupling groove, according to another embodiment.

First, referring to FIG. 5A, a coupling groove 36, according to an embodiment, is formed in the lower surface of the second sealing part 35, and grooves are formed as concentric circles.

A melted material, such as solder, forming the dummy terminal 40 is introduced into the coupling groove 36 at the time of forming the dummy terminal 40.

Therefore, a bonded area between the dummy terminal 40 and the second sealing part 35 is increased by the coupling groove 36. In addition, the shape of the coupling groove 36 enables the dummy terminal 40 to be partially inserted into the second sealing part 35 and attached to the second sealing part 35. Therefore, bonding force between the dummy terminals 40 and the second sealing part 35 is increased.

In addition, referring to FIG. 5B, a coupling groove 36, according to an embodiment, has dimensions or a size corresponding to a diameter of the dummy terminal, and includes protrusions 36a, which are disposed therein. A bonded area between the second sealing part 35 and the dummy terminal 40 is increased by the protrusions 36a.

As described above, the coupling groove 36, according to an embodiment, may have various shapes and dimensions as long as the dummy terminal 40 is firmly attached to the second sealing part 35.

In the electronic device module, according to an embodiment as described above, the electronic components are mounted on both surfaces of the board. In addition, the board and the external connection terminals are electrically connected to each other by the connection conductors disposed on the lower surface of the board.

Therefore, a plurality of electronic components may be mounted on a single board, such that a degree of integration of the electronic components is increased.

In addition, because the dummy terminals are formed on the outer surface of the sealing part in a double-sided mold structure and are bonded to the main board, the coupling force between the electronic device module and the main board is increased. Therefore, in a case in which the force of an external impact is transferred to the main board or the electronic device module, the impact is suppressed to the main board and the electronic device module, preventing them from being damaged or become electrically disconnected from each other.

Next, a method of manufacturing an electronic device module according to the present exemplary embodiment will be described.

FIGS. 6 through 18 are cross-sectional views illustrating a method of manufacturing the electronic device module illustrated in FIG. 1.

Figure 6:
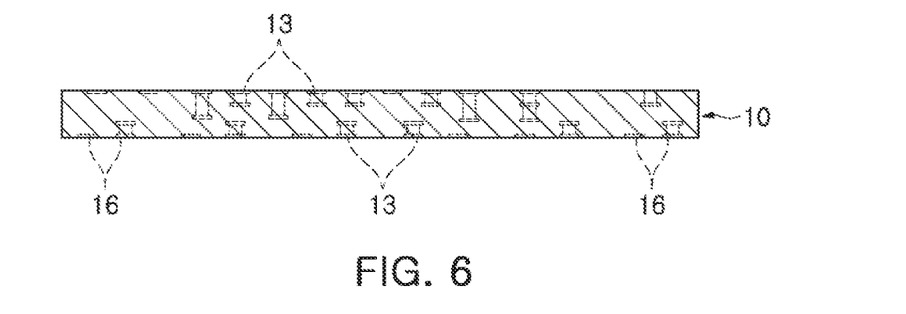
FIGS. 6 through 18 are cross-sectional views illustrating a method of manufacturing the electronic device module illustrated in FIG. 1, according to an embodiment.

Referring to FIGS. 6 through 13, as illustrated in FIG. 6, the board 10 is first prepared. As described above, the board 10 is a multilayer board, and has the mounting electrodes 13 formed on both surfaces thereof. In addition, the board 10 has the connection pads 16 formed on the lower surface thereof.

Figure 7:
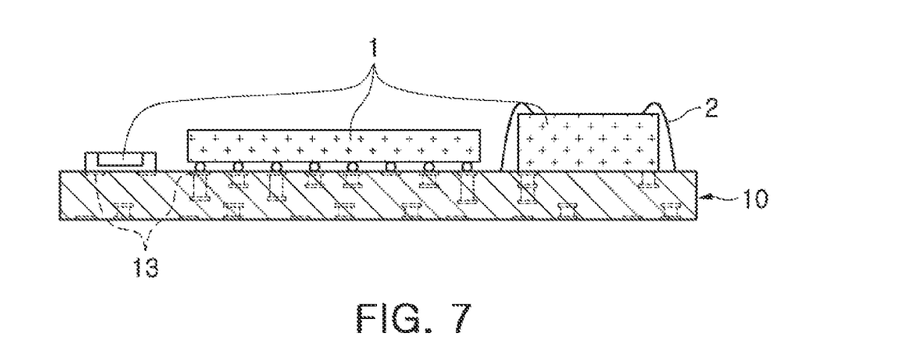

Then, as illustrated in FIG. 7, the electronic components 1 are mounted on one surface, that is, the upper surface, of the board 10. The electronic components 1 are mounted on one surface of the board 10 using a screen printing screen that prints a solder paste on the mounting electrodes 13 formed on one surface of the board 10, seating the electronic components 1 on the solder paste, and applying heat to the solder paste to harden the solder paste.

However, the electronic components 1 are not limited to being mounted as described above. For example, using bonding wires 2, the electronic components 1 may be mounted on one surface of the board 1 by seating the electronic components 1 on one surface of the board 10 and then electrically connecting the mounting electrodes 13, formed on the board 10, and electrodes of the electronic components 1 to each other.

Figure 8:
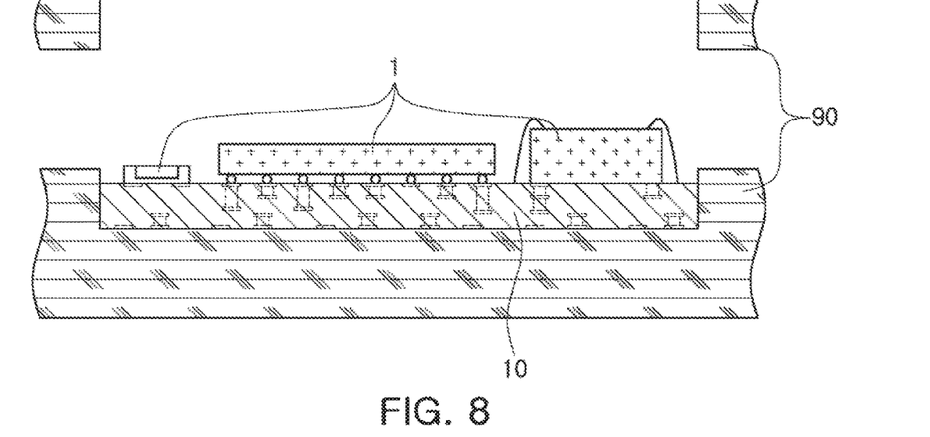

The first sealing part 31 is formed on one surface of the board 10. In detail, as illustrated in FIG. 8, the board 10 on which the electronic components 1 are mounted may first be disposed in a mold 90.

Figure 9:
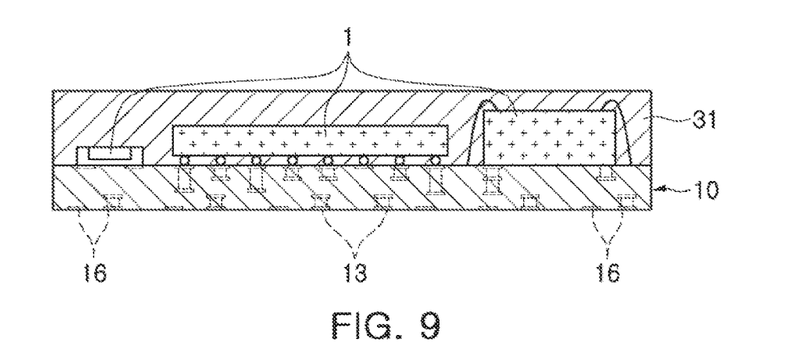

A resin is injected into the mold 90 to form the first sealing part 31. Therefore, as illustrated in FIG. 9, the electronic components 1 mounted on one surface, such as the upper surface, of the board 10 are protected by the first sealing part 31.

Figure 10:
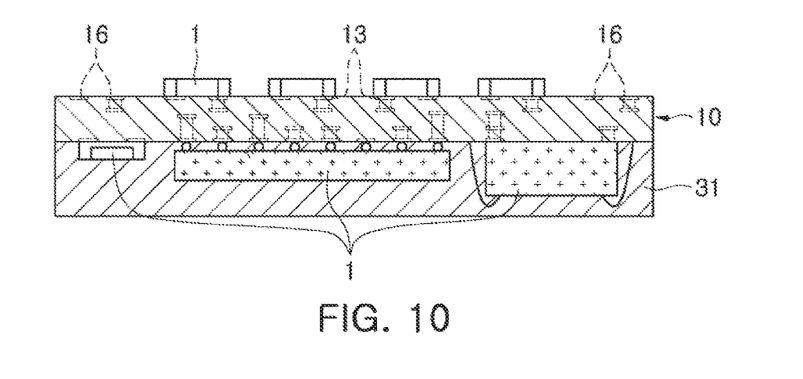

Then, as illustrated in FIG. 10, the electronic components 1 are mounted on the lower surface of the board 10. The electronic components 1 are mounted on the lower surface of the board 10 by using a screen printing scheme in which a solder paste is printed on the mounting electrodes 13, seating the electronic components 1 on the solder paste, and applying heat to the solder paste to harden the solder paste.

Figure 11:
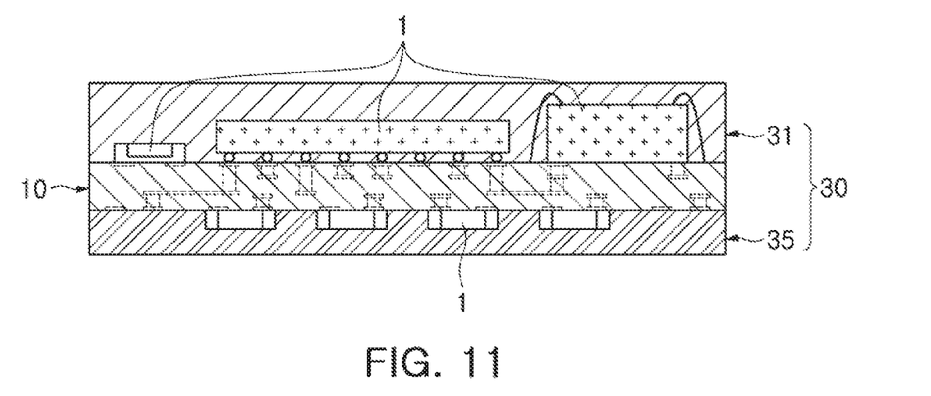

As illustrated in FIG. 11, the second sealing part 35 is formed beneath the board 10. The second sealing part 35 is formed beneath the board 10 by disposing the board 10 in the mold 90 and then injecting a molding resin into the mold 90, similar to the embodiment illustrated in FIG. 8.

Figure 12:
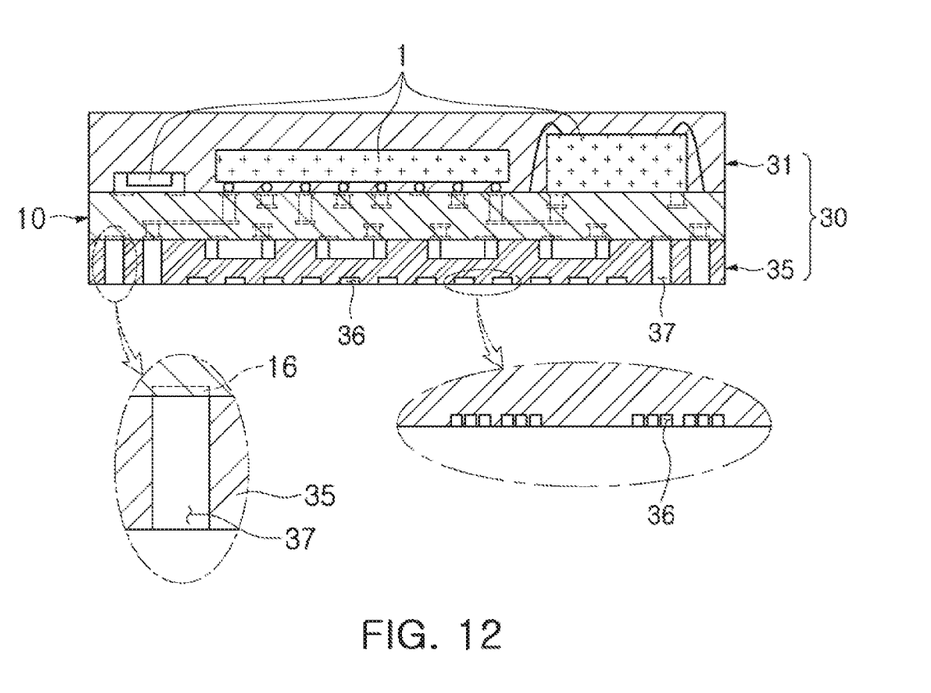

As illustrated in FIG. 12, the via holes 37 are formed in the second sealing part 35. The via holes 37 are formed in a laser drilling scheme.

The via holes 37 are formed in positions corresponding to the connection pads 16 of the board 10, and generally have a cylindrical shape.

In addition, at the time of forming the via holes 37, the coupling grooves 36 for forming the dummy terminals 40 are formed.

The coupling grooves 36 are formed in positions in which the dummy terminals 40 are formed, and have a shape of grooves that are partially depressed through laser drilling. However, the coupling grooves 36 may also have a shape of protrusions, in alternative configurations.

Therefore, in the method of manufacturing an electronic device module, according to an embodiment, the via holes 37 are formed using laser drilling and, at the same time, a laser used in the laser drilling may also be irradiated on positions on which the dummy terminals 40 are to be formed on the outer surface of the second sealing part 35, thereby forming a plurality of coupling grooves 36.

Figure 13:
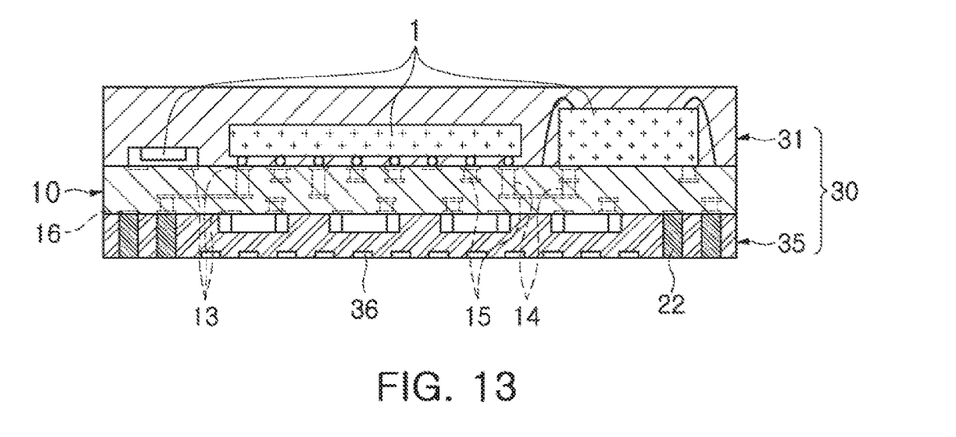

As illustrated in FIG. 13, the connection conductors 22 are formed.

The connection conductors 22 are formed by filling the via holes 37 (see FIG. 12) with a conductive paste and then melting and hardening the conductive paste. In addition, the connection conductors 22 are also formed by plating.

Figure 14:
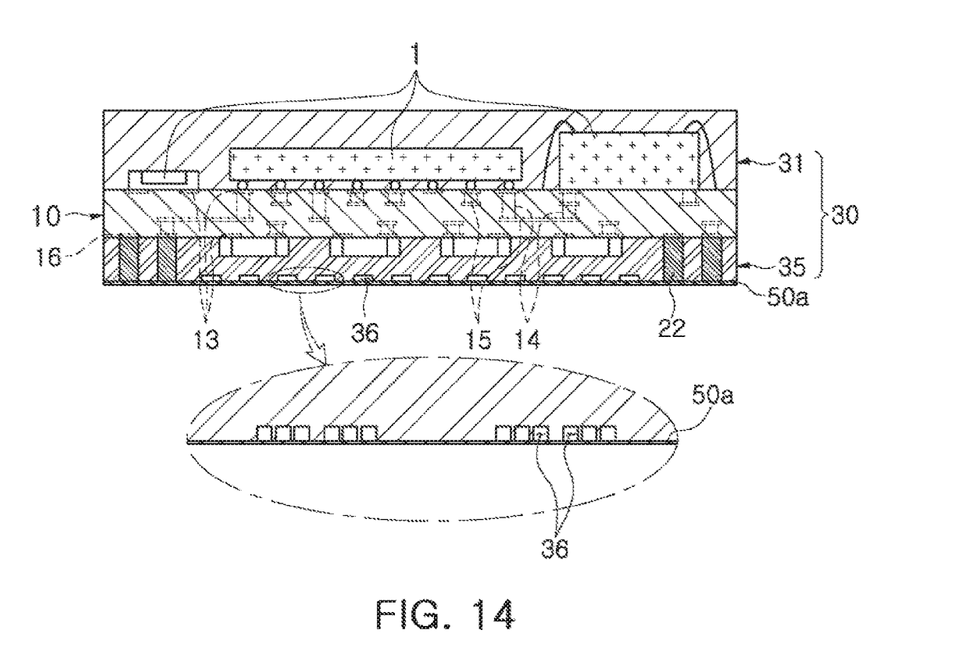
Figure 15:
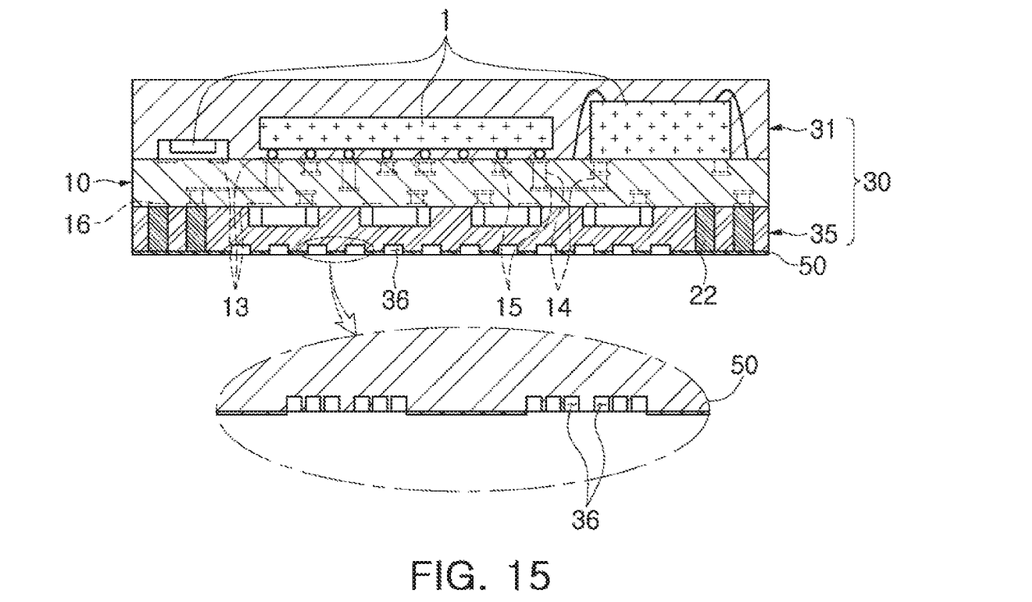

A mask 50 is formed on the lower surface of the second sealing part 35. For example, as illustrated in FIG. 14, a photo-resist 50a is applied to the lower surface of the second sealing part 35. Further, as illustrated in FIG. 15, in one illustrative example, only portions of the photo-resist corresponding to the coupling grooves 36 are removed to complete the mask 50. In accordance with other examples, other portions of the photo-resist of the coupling grooves 36 may be removed to complete the mask 50.

Figure 16:
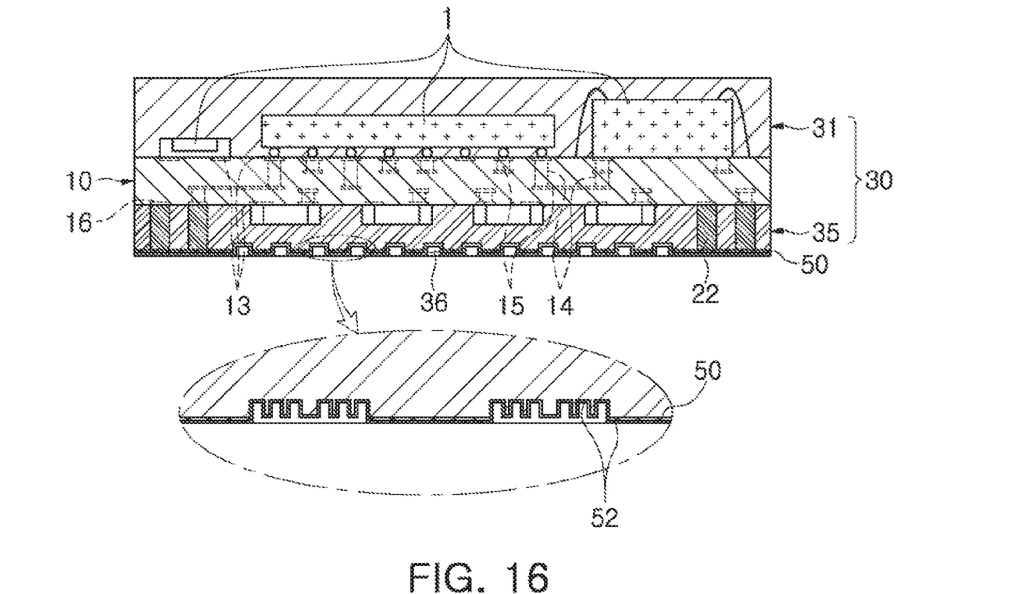

As illustrated in FIG. 16, under bump metallization (UBM) 52 is formed. In one example, the UBM 52 is formed of chrome, copper, or an alloy thereof, but other material may also be used. In addition, the UBM 52 is formed on the entire lower surface of the second sealing part 35 and in the coupling grooves 36.

Figure 17:
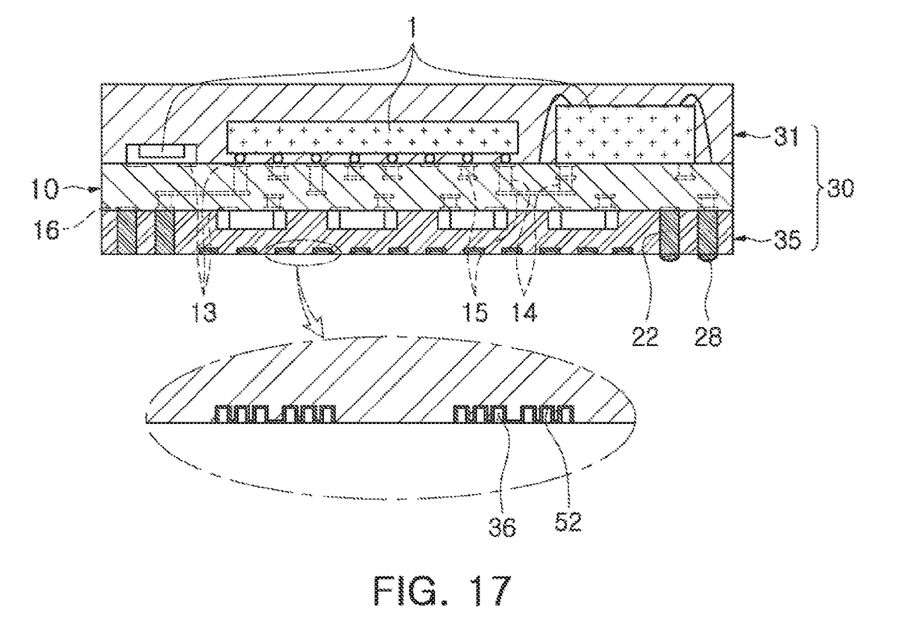

As illustrated in FIG. 17, the UBM 52 in the coupling grooves 36 is maintained, and the UBM 52 formed on the lower surface of the second sealing part 35 is removed. Therefore, in one example, the UBM 52 exclusively remains in the coupling grooves 36. Further, the mask 50 may also be removed together with the UBM at the time of removing the UBM 52.

The UBM 52 is removed through wet etching. Other methods such as dry etching, polishing of the lower surface of the second sealing part 35 may be used to remove the UBM 52 formed on the lower surface of the second sealing part 35.

Figure 18:
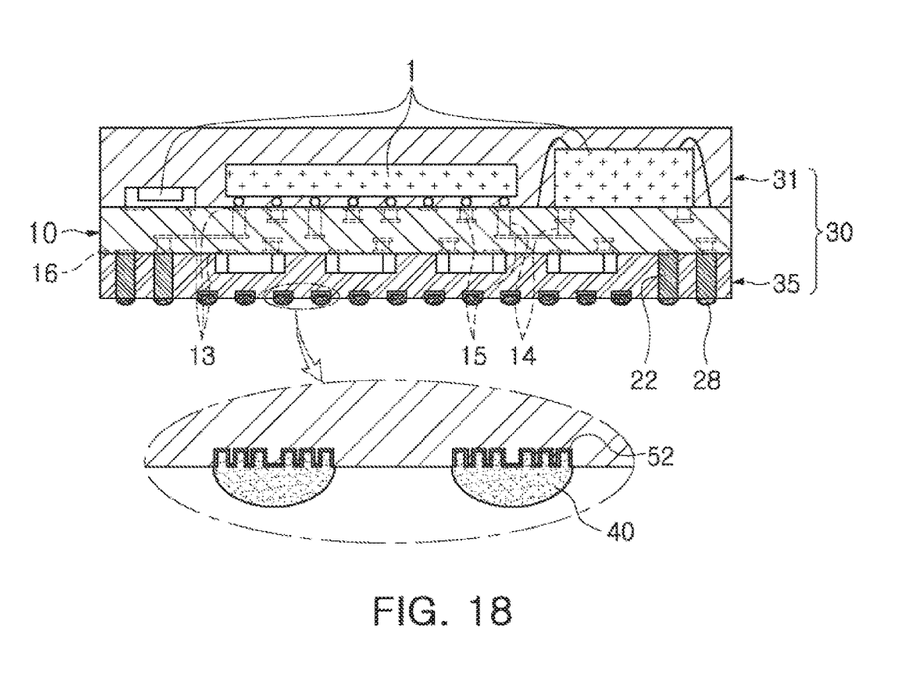

As illustrated in FIG. 18, the external connection terminals 28 and the dummy terminals 40 are formed.

The external connection terminals 28 and the dummy terminals 40 are formed by applying solder paste to distal ends of the connection conductors 22 and the coupling grooves 36 and then melting and hardening the solder paste.

Therefore, the external connection terminals 28 are bonded to the distal ends of the connection conductors 22, and the dummy terminals 40 are bonded to the UBMs 52 formed in the coupling grooves 36, thereby completing the electronic device module 100, according to the embodiment illustrated in FIG. 1.

Further, the external connection terminals 28 or the dummy terminals 40 may have various dimensions and shapes such as a bump shape or a solder ball shape.

In accordance with an example, a method of manufacturing an electronic device module is not limited to the above-mentioned method. For example, after the electronic components 1 are mounted on the lower surface of the board 10 as illustrated in FIG. 10, connection conductors 22 is separately manufactured and has a metal post shape are mounted on the connection pads 16, the second sealing part 35 is formed, and the coupling grooves 36 are formed in the second sealing part 35, whereby a structure illustrated in FIG. 13 is completed.

In the electronic device module 100, according to an embodiment as described above, the electronic components 1 may be mounted on both surfaces of the board 10 and be sealed by the sealing part 30. Therefore, a large number of components are mounted in one electronic device module 100 and are easily protected from the external environment.

In addition, because a coupling force between the electronic device module and the main board is secured by the dummy terminals, even in a case in which the force of an external impact is transferred to the main board or the electronic device module, the main board and the electronic device module are not easily damaged nor are electrically disconnected from each other.

In addition, because the dummy terminals 40 are collectively formed together with the external connection terminals 28 at the time of applying, melting, and hardening the solder paste to form the external connection terminals 28, the electronic device module may be easily manufactured.

Further, although in one embodiment, the second sealing part 35 is formed after the first sealing part 31 is formed, a sequence in which the first and second sealing parts 31 and 32 are formed is not limited thereto, but may be variously modified. For example, the second sealing part 35 may first be formed, or the first and second sealing parts 31 and 35 may be simultaneously formed.

Figure 19A:
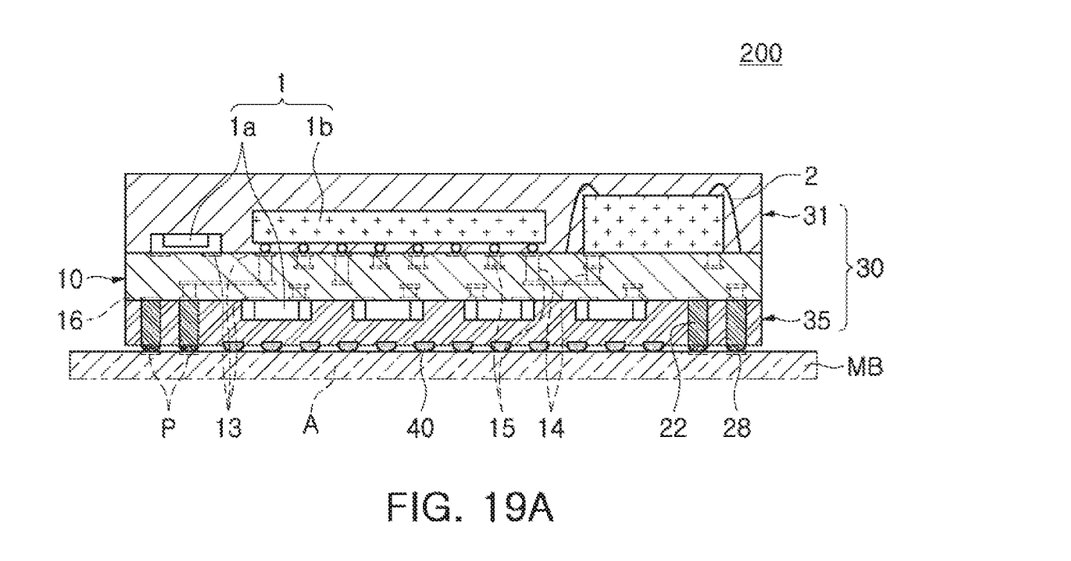
FIGS. 19A and 19B are views illustrating a method of manufacturing an electronic device module, according to another embodiment.
Figure 19B:
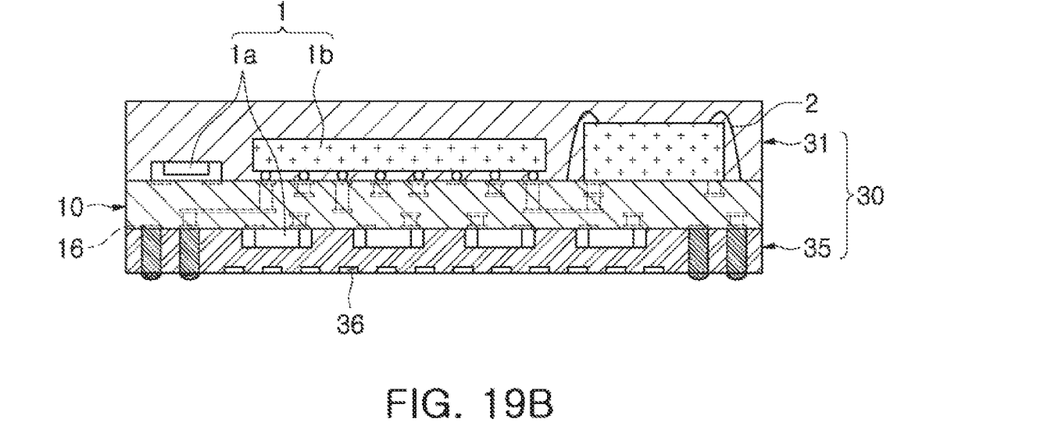

FIGS. 19A and 19B are views illustrating a method of manufacturing an electronic device module, according to another embodiment.

Referring to FIG. 19A, in an electronic device module 200, according to an embodiment, dummy terminals 40, dummy bonding parts, are formed of a material different from that of the external connection terminals 28.

For example, the dummy terminals 40 are not formed of a metal, but are formed of a resin. For example, the dummy terminals 40 are formed of a thermoplastic resin.

In this case, at the time of performing reflow to mount the electronic device module 200 on the main board MB, the dummy terminals 40 are melted by heat and are bonded to the main board MB while being re-hardened; thus, bonding the main board MB and the electronic device module 200 to each other.

In addition, in a case of the above-mentioned embodiment, because the dummy terminals 40 are formed of a conductive paste, the conductive pads P to which the dummy terminals 40 are bonded are provided on the main board MB.

However, in an embodiment, because the dummy terminals 40 are formed or made of the resin, the conductive pads P are not required to be on portions onto which the dummy terminals 40 are bonded. Therefore, in accordance with an advantage of the present embodiment, additional conductive pads are not need to be formed on the main board.

In the electronic device module 200, according to an embodiment described above, at the time of forming the connection conductors 22 as illustrated in FIG. 13, the conductive paste is applied to the distal ends of the connection conductors 22 and is then melted and hardened, thereby forming external connection terminals 28 as illustrated in FIG. 19A. In one non-limiting example, the conductive paste is only applied to the distal ends of the connection conductors 22. In another non-limiting example, the conductive paste is applied to the distal ends and other portions of the connection conductors 22.

Further, thermoplastic adhesives are applied to the coupling grooves 36 to form dummy terminals 40 as illustrated in FIG. 19A, thereby completing the electronic device module 200.

Therefore, in accordance with one advantage, the electronic device module 200 is very easily manufactured.

Figure 20A:
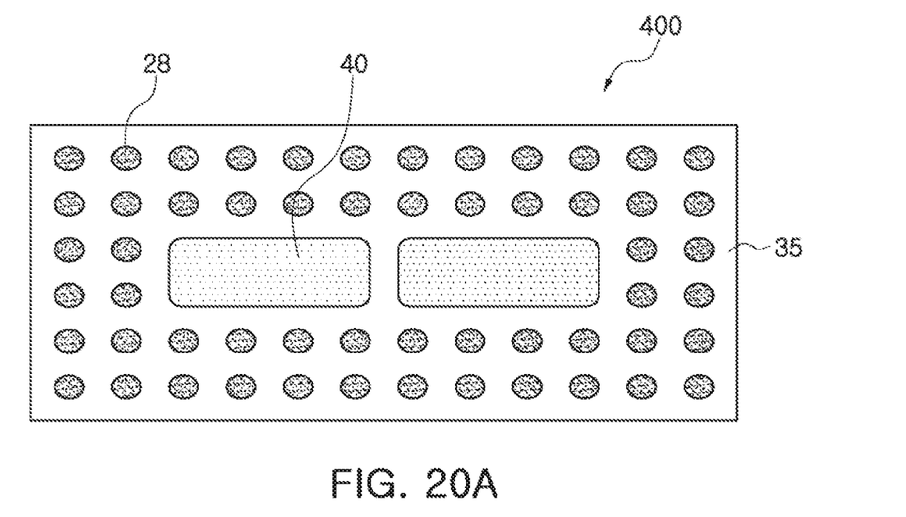
FIGS. 20A and 20B are bottom views of electronic device modules, according to another embodiment.
Figure 20B:
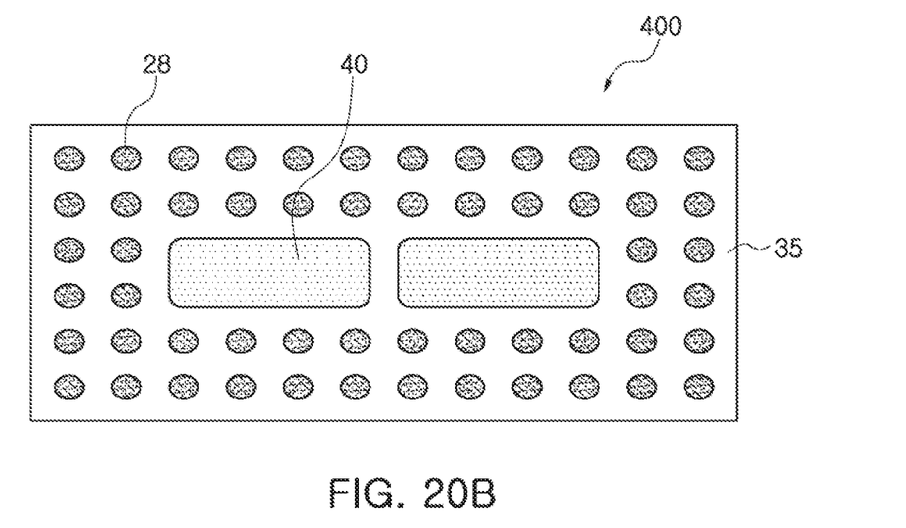

FIGS. 20A and 20B are bottom views of electronic device modules, according to another embodiment.

In an electronic device module 300 illustrated in FIG. 20A and an electronic device module 400 illustrated in FIG. 20B, the above-mentioned dummy bonding parts 40 do not have a solder bump shape, but may have the form of a pad with a wide area (hereinafter, the dummy bonding parts 40 will be referred to as dummy pads).

The dummy pads 40 are formed of a conductive material or a thermoplastic material, and perform the same functions as that of the dummy terminals, according to the embodiment described above.

Figure 21:
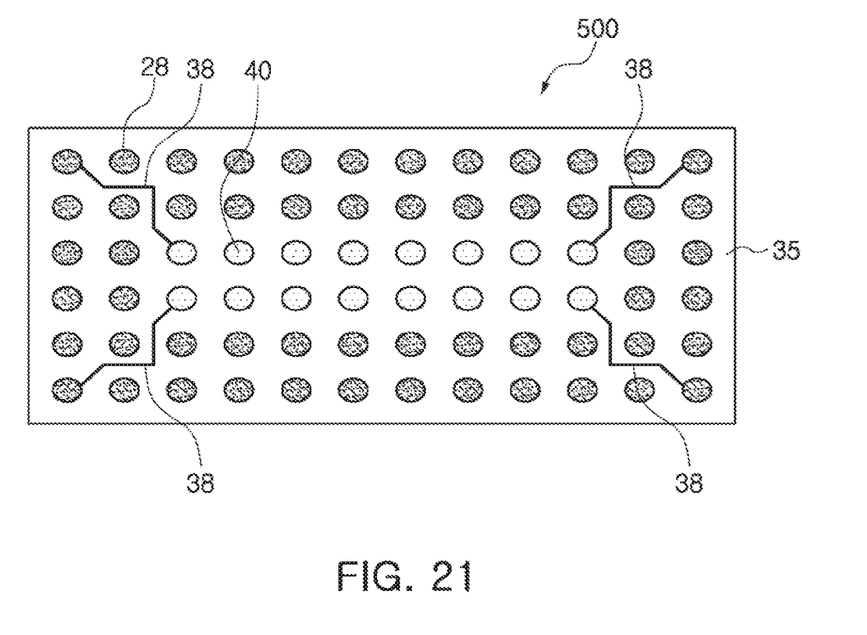
FIG. 21 is a bottom view of an electronic device module, according to another embodiment.

FIG. 21 is a bottom view of an electronic device module, according to another embodiment.

In an electronic device module 500, according to an embodiment, dummy terminals 40 are formed of a conductive material.

In addition, the electronic device module 500 includes auxiliary patterns 38, electrically connecting at least one dummy terminal 40 and at least one external connection terminal 28 to each other.

The auxiliary patterns 38 are formed on a lower surface of the second sealing part 35, on which the dummy terminals 40 are formed, and are formed through spaces between the external connection terminals 28 and the dummy terminals 40.

The auxiliary patterns 38 are formed by the above-mentioned UBM 52. For example, at the time of forming the UBM 52, as illustrated in FIGS. 15 through 17, the auxiliary patterns 38 are formed by allowing portions corresponding to the auxiliary patterns 38 to remain without removing the entire UBM 52 formed on the lower surface of the second sealing part 35, when removing the UBM 52 that is formed on the lower surface of the second sealing part 35.

Therefore, the auxiliary patterns 38 substantially electrically connect the connection conductors 22 (see FIG. 1) and the UBMs 52 of the dummy terminals 40 to each other.

As the auxiliary patterns 38 are formed, at least one connection conductor 22 is electrically connected to at least one dummy terminal 40. Therefore, in a case in which any one of the external connection terminals 28 is damaged, a connection conductor 22, bonded to the damaged external connection terminal, is electrically connected to the main board through a dummy terminal 40, through the auxiliary pattern 38.

As set forth above, in the electronic device module, according to an embodiment, the electronic devices are mounted on both surfaces of the board and are sealed by the sealing part. Therefore, many devices may be mounted in one electronic device module and be easily protected from the external impact.

In addition, the electronic device module, according to an embodiment includes one or more dummy terminals, and a coupling force between the electronic device module and the main board is secured by the dummy terminals. Therefore, even in the case in which the force of an external impact is transferred to the main board or the electronic device module, the main board and the electronic device module are protected from being damaged or electrically disconnected from each other.

In addition, because the dummy terminals are collectively formed, together with the external connection terminals when applying, melting, and hardening the solder paste to form the external connection terminals, the electronic device module is easily manufactured.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing an electronic device module, comprising:
    sealing an electronic component to form a sealing part, wherein the electronic component is mounted on a board; and
    forming an external connection terminal and a dummy bonding part on one surface of the sealing part, wherein the forming of the external connection terminal and the dummy bonding part comprises:
    attaching the external connection terminal to a surface of the sealing part;
    forming a coupling groove at a position in which the dummy bonding part is to be formed on a surface of the sealing part, the coupling groove comprising a protrusion; and
    attaching the dummy bonding part to the coupling groove.

2. The method of claim 1, further comprising:
    forming a connection conductor penetrating through the sealing part; and
    bonding the external connection terminal to the connection conductor.

3. The method of claim 1, wherein the forming of the external connection terminal and the dummy bonding part comprises:
    applying a solder paste to positions in which the external connection terminal and the dummy bonding part are to be formed on a surface of the sealing part; and
    melting and hardening the solder paste.

4. The method of claim 1, wherein a thermoplastic adhesive is applied to the coupling groove to attach the dummy bonding part to the coupling groove.

5. The method of claim 1, wherein the forming of the dummy bonding part comprises:
    forming an under bump metallization (UBM) in the coupling groove; and
    attaching the dummy bonding part to the UBM.

6. The method of claim 2, further comprising:
    forming an auxiliary pattern on one surface the sealing part, the auxiliary pattern electrically connecting the dummy bonding part and the connection conductor to each other.

* * * * *